(12) United States Patent
Nagadomi et al.

(10) Patent No.: US 8,732,553 B2
(45) Date of Patent: May 20, 2014

(54) MEMORY SYSTEM AND CONTROL METHOD THEREOF

(75) Inventors: Yasushi Nagadomi, Kanagawa (JP); Daisaburo Takashima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 284 days.

(21) Appl. No.: 13/238,685

(22) Filed: Sep. 21, 2011

(65) Prior Publication Data
US 2012/0166906 A1 Jun. 28, 2012

(30) Foreign Application Priority Data
Dec. 27, 2010 (JP) ................................. 2010-290778

(51) Int. Cl.
*G11C 29/00* (2006.01)
(52) U.S. Cl.
USPC ........... 714/768; 714/782; 714/777; 714/755; 714/786
(58) Field of Classification Search
USPC .......................... 714/768, 755, 786, 777, 782
See application file for complete search history.

(56) References Cited

U.S. PATENT DOCUMENTS

| | | | |
|---|---|---|---|
| 6,182,264 B1 * | 1/2001 | Ott | ................................. 714/774 |
| 7,900,117 B2 | 3/2011 | Kanno | |
| 2006/0036925 A1 * | 2/2006 | Kyung et al. | ................. 714/758 |
| 2009/0144598 A1 * | 6/2009 | Yoon et al. | ..................... 714/752 |
| 2009/0183052 A1 | 7/2009 | Kanno et al. | |
| 2011/0047441 A1 | 2/2011 | Yamaga | |
| 2011/0197109 A1 | 8/2011 | Kanno et al. | |
| 2011/0197110 A1 | 8/2011 | Kanno et al. | |

FOREIGN PATENT DOCUMENTS

| | | |
|---|---|---|
| JP | 2007-87464 | 4/2007 |
| JP | 2008-300020 | 12/2008 |
| JP | 2009-59422 | 3/2009 |
| JP | 2009-211209 | 9/2009 |

OTHER PUBLICATIONS

U.S. Appl. No. 12/887,875, filed Sep. 22, 2010, Toshikatsu Hida, et al.

* cited by examiner

*Primary Examiner* — Guy Lamarre
(74) *Attorney, Agent, or Firm* — Oblon, Spivak, McClelland, Maier & Neustadt, L.L.P.

(57) ABSTRACT

The embodiments include an error correction processing unit and an error correction history recording unit. The error correction processing unit performs an error correction process based on data read from a non-volatile semiconductor memory and a second-step error correction code corresponding to the data. The error correction history recording unit records error correction history indicating whether first error correction is successful through the first error correction process, in association with unit data. When error correction history of target unit data to be read indicates that correction is not successful, the second error correction process is executed without executing the first error correction process.

20 Claims, 8 Drawing Sheets

FIG.3

| ADDRESS | L1 ECC RESULT |
|---------|---------------|
| 0000    | 0             |
| 0001    | 0             |
| 0002    | 1             |
| 0003    | 0             |
| 0004    | 1             |
| ...     | ...           |

FIG.6

| ADDRESS | ECC RESULT |
|---|---|
| 0000 | 0000 |
| 0001 | 0011 |
| 0002 | 0001 |
| 0003 | 0111 |
| 0004 | 1111 |
| ... | ... |

FIG.7

| ADDRESS | L1 ECC RESULT | L1 ECC CORRECTION BIT |
|---|---|---|
| 0000 | 0 | 3 |
| 0001 | 0 | 2 |
| 0002 | 1 | 0 |
| 0003 | 0 | 0 |
| 0004 | 1 | 2 |
| ... | ... | ... |

FIG.9

| ADDRESS | L1 ECC RESULT | L1 ECC CORRECTION BIT | NUMBER OF "READ" TIMES/BLOCK |
|---|---|---|---|
| 0000 | 0 | 3 | 10 |
| 0001 | 0 | 2 | 10 |
| 0002 | 1 | 0 | 10 |
| 0003 | 0 | 0 | 10 |
| 0004 | 1 | 2 | 20 |
| ... | ... | ... | ... |

MEMORY SYSTEM AND CONTROL METHOD THEREOF

CROSS-REFERENCE TO RELATED APPLICATIONS

This application is based upon and claims the benefit of priority from Japanese Patent Application No. 2010-290778, filed on Dec. 27, 2010; the entire contents of which are incorporated herein by reference.

FIELD

Embodiments described herein relate generally to a memory system and its control method.

BACKGROUND

In recent years, semiconductor memories are used everywhere, for example, for the main memories on large computers, personal computers, electric appliances for home use, and mobile phones. Particularly, flash memories are getting most of the attention. Flash memories (Flash EEPROM (Electrically Erasable and Programmable Read Only Memory) type non-volatile memories) are used for many information units, such as mobile phones or digital cameras. This is because data do not disappear even if the power is OFF, and the memories have a configuration suitable for high integration.

The flash memories mainly include NOR and NAND flash memories. In the NOR flash memories, high-speed "Read" operations are possible. The number of possible "Read" times is approximately 1013. Thus, the NOR flash memories are used as instruction code memories of mobile units. However, the NOR flash memories are not suitable for file storage, because the Write bandwidth is narrowed.

On the other hand, the NAND flash memories can be more highly-integrated than the NOR flash memories. For "Read", the access time is approximately 25 microseconds, so is very slow, but enables Burst Read operations. Further, the NAND flash memories have wide bandwidth. For "Write", the "Program" (writing) time is approximately 200 microseconds, and "Erase" (deleting) time is approximately 1 ms, thus are very slow. However, a large number of bits can be "Programmed" or "Erased" at one time. Thus, a large number of bits can be "Programmed" in the unit of Pages at one time. Accordingly, the NAND flash memories can be highly-integrated, have wide bandwidth, and thus are used for memory cards, USB (Universal Serial Bus) memories, mobile phones, memories for portable music players. Recently, SSD (Solid State Drive) is for sale as replacement for the hard disk.

BRIEF DESCRIPTION OF THE DRAWINGS

FIG. 3 is a diagram illustrating a configuration example of an error correction history management table, in the first embodiment;

FIG. 6 is a diagram illustrating a configuration example of the error correction history management table, when an ECC process is performed in five stages;

FIG. 7 is a diagram illustrating a configuration example of an error correction history management table, in a second embodiment;

FIG. 9 is a diagram illustrating a configuration example of an error correction history management table, in the second embodiment.

DETAILED DESCRIPTION

Figure 1:
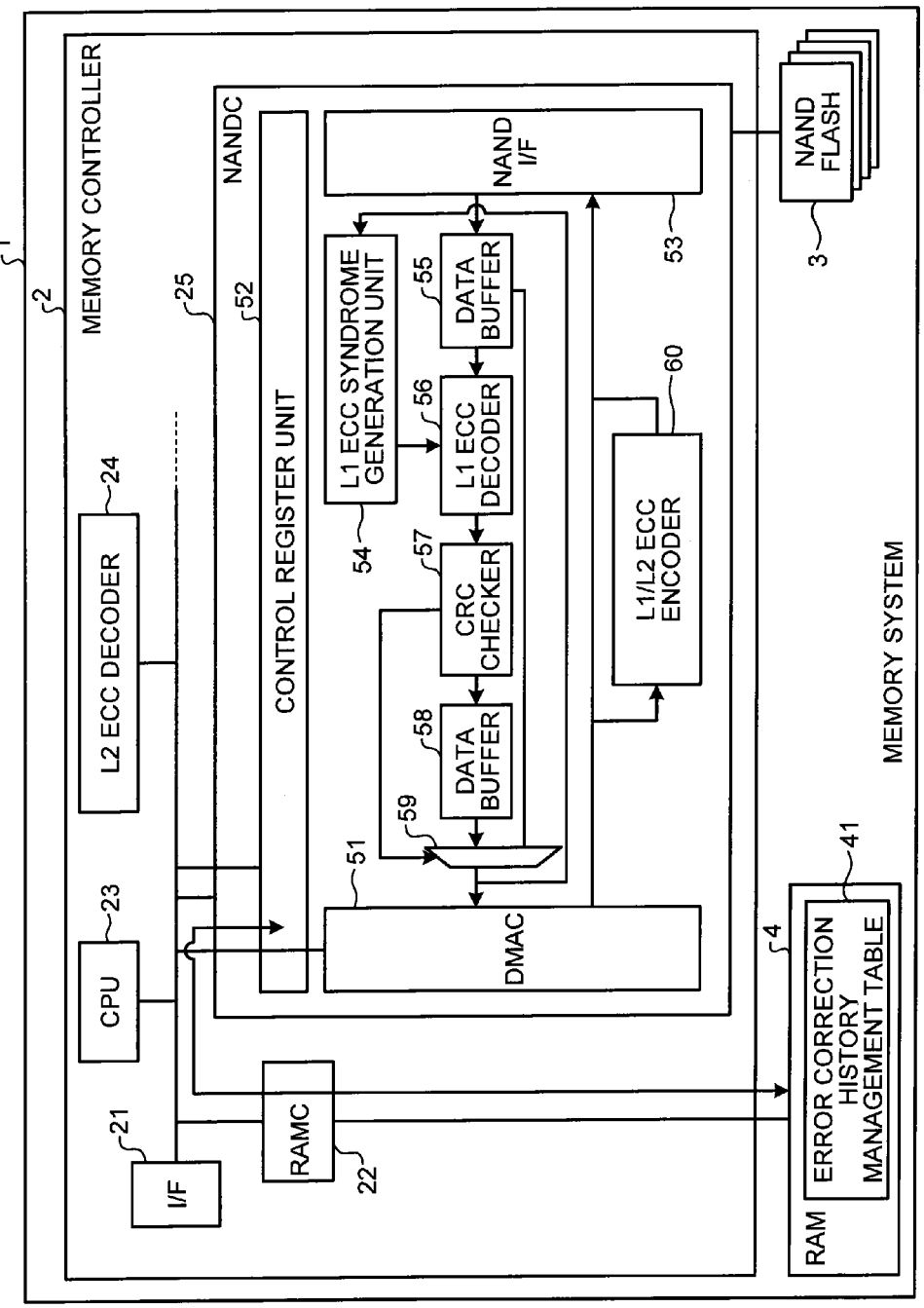
FIG. 1 is a diagram illustrating an example of a functional configuration of a memory system according to a first embodiment.

This embodiment includes a non-volatile semiconductor memory which can record data of plural units, a first error correction code which is generated in association with each of data units, and a second error correction code which is generated for the entire data units. The embodiment includes an error correction processing unit and an error correction history information recording unit. The error correction processing unit performs an error correction process based on unit data and a first error correction code or a second error correction code, that are read from the non-volatile semiconductor memory. These first and second error correction codes correspond to the unit data. The error correction history information recording unit stores error correction history in association with each unit data. This error correction history indicates whether an error correction process is not successful by the error correction processing unit using the first error correction code. Further, this embodiment controls the error correction processing unit to execute an error correction process using the second error correction code without executing the error correction process using the first error correction code, when error correction history corresponding to target unit data to be read indicates that correction is not successful.

An issue to be concerned is the reliability (restriction of the number of "Program"/"Erase", "Read" times), when the hard disk is replaced with a NAND flash memory.

Descriptions will now be made to the restricted number of "Program"/"Erase" times. In "Write" ("Program"/"Erase") of flash memory, high voltage is applied between the substrate and the gate, thereby injecting/emitting electrons into/from the floating gate. In the case of a binary NAND, data is set from "1" to "0" in "Program", while data is set from "0" to "1" in "Erase". If this setting is repeated, the oxide film around the floating gate is damaged. Then, if the damaged film is left as is for a long time, the electrons injected into the floating gate come out, resulting in destroying the written data. In the case of a binary NAND, data is changed from "0" to "1". That is, if the number of "Write" times increases, the retention characteristics are deteriorated.

The number of "Write" times of the recent NAND flash memory is approximately $10^5$, that is, the number of "Write" times is smaller than that of another non-volatile memory. When the NAND flash memory is used as a hard disk, the data may be destroyed due to exceeding the restriction of the number of "Program/Erase" times, thus possibly damaging the system. As a step for the restriction of the number of "Program/Erase" times, wear-leveling is executed to level the number of "Program/Erase" times, by counting the number of "Erase" times for each Block and translating physical addresses of Blocks. Specifically, the blocks include a block(s) with a large number of "Erase" times that is greater than a predetermined threshold value and a block(s) with a small number of "Erase" times.

Now, descriptions will be made to "Read" of the NAND flash memory. In the NAND flash memory, a determination is made as to whether data is "1" or "0". At this time, this determination depends upon whether a selective cell is electrically conductive, by applying 0V to the gate of the selective cell and high voltage (Vread) to the gate of a non-selective cell and the selective gate. If this "Read" is repeated, high voltage is repeatedly applied to the non-selective cell (all Pages except those to be Read in the unit of Blocks). The electrons pass through the oxide film and get into the floating gate. This causes a change in the threshold value of the cell, and destroys the data. In the binary NAND, the data changes from "1" to "0". This is called "read disturbance".

Further, the oxide film is further deteriorated due to "Program/Erase" operations, as the flash memory is used. Thus, the read disturbance may frequently occur. Presently, in the NAND flash memory, the number of "Read" times is approximately $10^4$. In the NAND flash memory, the multi-level modulation advances in such a manner that information of two bits or more is stored in a single cell. This is a tendency that the threshold value cannot easily be controlled. From this time on, the effect of the read disturbance may possibly cause a serious problem. To prevent the read disturbance, the block(s) with a large number of "Read" times should appropriately be rewritten, and the threshold value needs to be reset (refreshed).

To protect data from the effect of the repetition of the above-described "Write/Read", an ECC (Error Check and Correct) technique is used in the memory system using the NAND flash memory. The number of data errors increases in accordance with the fatigue level of the memory cell. Thus, recently, a proposed system implements multi-step ECC. In this multi-step ECC, the ECC with low correction performance is executed at the initialization of the "Write/Read", and then the ECC with high correction performance is executed.

Descriptions will now be made to an example of implementing a two-step ECC process. In the ECC process in the first step (L1 ECC process), a CRC (Cyclic Redundancy Check) code as an error detection code and an ECC code for the first step (L1) are added to each minimum data unit to be written, when target data is written into the NAND flash memory. As an L1 ECC code, a code for enabling a high-speed correction process is used. Examples of such a code include a hamming code and a BCH code for enabling correction for a small number of bits. In the ECC process in the second step (L2 ECC process), an L2 ECC code is added to one or more pairs of minimum data units and the CRC code. This L2 ECC code has higher correction performance than the L1 ECC code. Examples of the L2 ECC codes include a BCH code for enabling correction for a large number of bits and an LDPC (Low Density Parity Check) code.

At the reading, when there are only a small number of errors (within the range of correction performance of the L1 ECC code), the errors are corrected using the L1 ECC code for enabling high-speed correction, without performing the correction using the L2 ECC code. When the correction cannot be successful using the L1 ECC code, the correction process is performed using the L2 ECC code. By executing this multi-step ECC, a high-speed process is executed when there are only a few errors, while high performance correction process is executed when there are many errors.

In the multi-step ECC process, at the reading, an L1 ECC syndrome is generated simultaneously with reading of data for a data buffer. After this, a correction process using the L1 ECC code is performed. Then, a check is made as to whether the correction is desirably performed through the L1 correction process (whether the L1 correction is successful), using a CRC code. When the correction is successful, data after corrected is transferred. When the correction is not successful, data before correction is transferred to the processing unit for performing the L2 ECC process. Now, the procedure shifts to the L2 ECC process. When reading data for which L1 correction was not successful in the past, the above-described L1 correction process is executed. This results in a long processing time.

Descriptions will now be made to a memory system and its control method, according to this embodiment, with reference to the attached drawings. The present invention is not limited to these embodiments.

(First Embodiment)

FIG. 1 is a diagram illustrating an example of a functional configuration of a memory system according to the first embodiment. As illustrated in FIG. 1, the memory system 1 of this embodiment includes a memory controller 2, a NAND flash memory (non-volatile semiconductor memory) 3, and a RAM (Random Access Memory: temporary recording unit) 4. The RAM 4 includes an error correction history management table 41.

The memory controller 2 includes an external interface (I/F) 21, a RAM controller (RAMC) 22, a CPU (Central Processing Unit) 23, an L2 ECC decoder 24, and a NAND controller (NANDC) 25.

The NAND controller 25 includes a DMAC (Direct Memory Access Controller) 51, a control register unit 52, a NAND flash memory interface (NAND I/F) 53, an L1 ECC syndrome generation unit 54, a data buffer 55, an L1 ECC decoder 56, a CRC checker 57, a data buffer 58, a selector 59, and an L1/L2 ECC encoder 60.

The memory system of this embodiment writes data transferred from a host (not illustrated) into the NAND flash memory 3, in response to a write request from the host, such as a PC (Personal Computer). The memory system reads data written into the NAND flash memory 3, and transfers the read data to the host, in response to a read request from the host.

Figure 2:
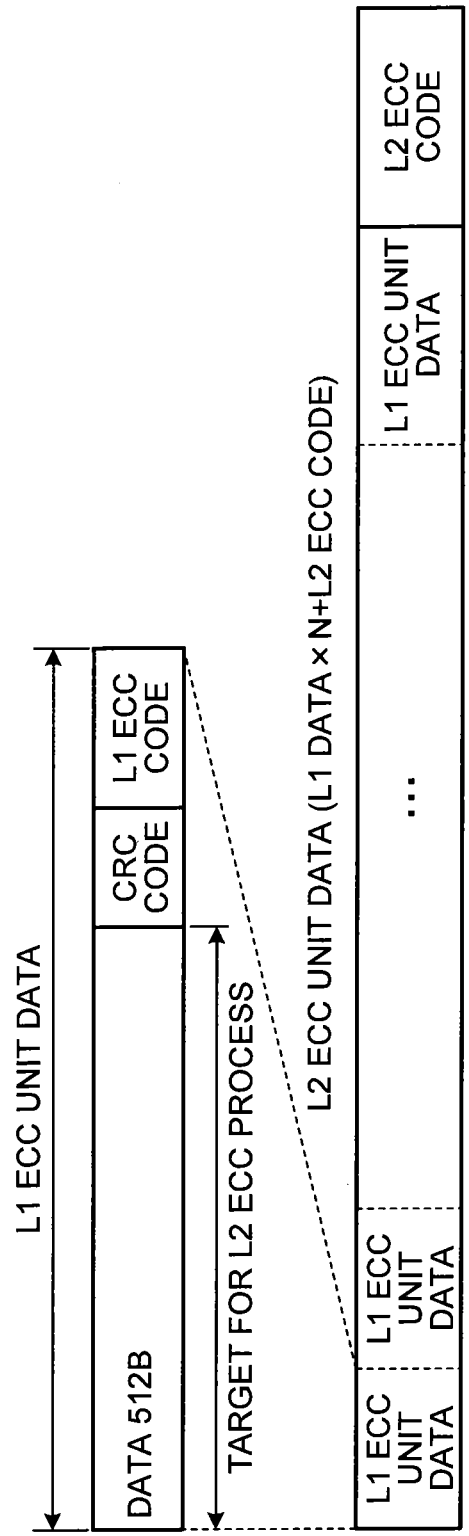
FIG. 2 is a diagram illustrating an example of a data configuration, when an ECC process is performed in two stages.

The memory system 1 of this embodiment executes the two-step ECC process. FIG. 2 is a diagram illustrating an example of a data configuration when the two-step ECC process is performed. In the example of FIG. 2, in the L1 ECC process, a CRC code and an L1 ECC code are generated and added to the minimum data unit to be written (512 bytes in this example). L1 ECC unit data includes the CRC code and the L1 ECC code, corresponding to the 512-byte data to be written. In the L2 ECC process, of the L1 ECC unit data, when the data (minimum unit data to be written) excluding the L1 ECC code and its corresponding CRC code are set as L1 CRC data, an N number (N is an integer equal to or greater than 1) of L1 CRC data is subjected to the L2 ECC process, so as to generate an L2 ECC code. Then, an N number of the L1 ECC unit data and the corresponding L2 ECC code are stored in the NAND flash memory 3.

FIG. 2 illustrates only one example. The minimum unit data to be written is not limited to 512 bytes, and may be any other bytes. In the example of FIG. 2, N=8. However, as long as N is equal to or greater than 1, N may be any other value.

Descriptions will now be made to a write operation in this embodiment. In response to a write request from the host through the I/F 21, the CPU 23 instructs the RAMC 22 to temporarily store target data to be written from the host through the I/F 21, into the RAM 4. Then, the target data to be written is temporarily stored in the RAM 4.

The CPU 23 instructs the DMAC 51 to read the data to be written from the RAM 4. The DMAC 51 outputs the data read from the RAM 4 to the L1/L2 ECC encoder 60. In this embodiment, as described above, the two-step ECC process is executed. In the L1 ECC process, the L1/L2 ECC encoder 60 generates a CRC code for each minimum unit data to be written, executes an L2 ECC process for an N number of L1 CRC data, thereby generating L2 ECC codes. The L2 ECC codes corresponding to the N number of L1 CRC unit data are written into the NAND flash memory 3 through the I/F 53.

It is preferred that L1 ECC codes include codes for enabling high speed correction processes, for example, a hamming code and a BCH code for enabling correction for a small number of bits. As an L2 ECC code, it is preferred to use a code with higher correction performance than the L1 ECC code. Such a code may, for example, be a BCH code for enabling correction for a large number of bits, or LDPC code.

Descriptions will now be made to a read operation in this embodiment. In response to a read request from the host through the I/F 21, the CPU 23 sets an address (on the NAND flash memory 3) of data corresponding to the target data to be read, into the control register unit 52. At this time, the CPU 23 refers to the error correction history management table 41 in the RAM 4, and simultaneously sets error correction history information corresponding to the target data to be read. Then, the NANDC 25 starts a process for reading data from the NAND flash memory 3.

In this embodiment, as a unit for executing the L1 ECC process, an L1 ECC processing unit entirely includes the L1 ECC syndrome generation unit 54, the data buffer 55, the L1 ECC decoder 56, the CRC checker 57, the data buffer 58, and the selector 59. This L1 ECC processing unit and the L2 ECC decoder 24 for executing the L2 ECC process form an error correction processing unit for performing the two-step ECC process. The configuration of the error correction processing unit for performing the two-step ECC process is not limited to the example of FIG. 1. The error correction processing unit may have any other configuration as long it has the same function.

FIG. 3 is a diagram illustrating a configuration example of the error correction history management table 41 in this embodiment. In the example of FIG. 3, the error correction history management table 41 includes an address(es) for each unit corresponding to the L1 ECC unit data and an L1 ECC result (error correction history information) that is a flag indicating whether the L1 ECC correction is not successful in the past L1 ECC process with respect to the L1 ECC unit data. In this example, as the error correction history information, the flag indicating the L1 ECC result is used. The flag indicating the result of the L1 ECC process is a one-bit value. When the L1 ECC correction is not successful in the past in the L1 ECC process, "1" is set. In any other case (when the L1 ECC correction is successful in the past or when there is no error in the L1 ECC, or when the read process is not performed in the past), "0" is set. The initial value of the flag indicating the L1 ECC result is set to "0", and the initial value of the flag is returned to "0" when the rewriting is performed. Note that some errors may occur without depending on the data refresh, such as an acquired column failure. In this case, the value is not necessarily reset to "0".

Figure 4:
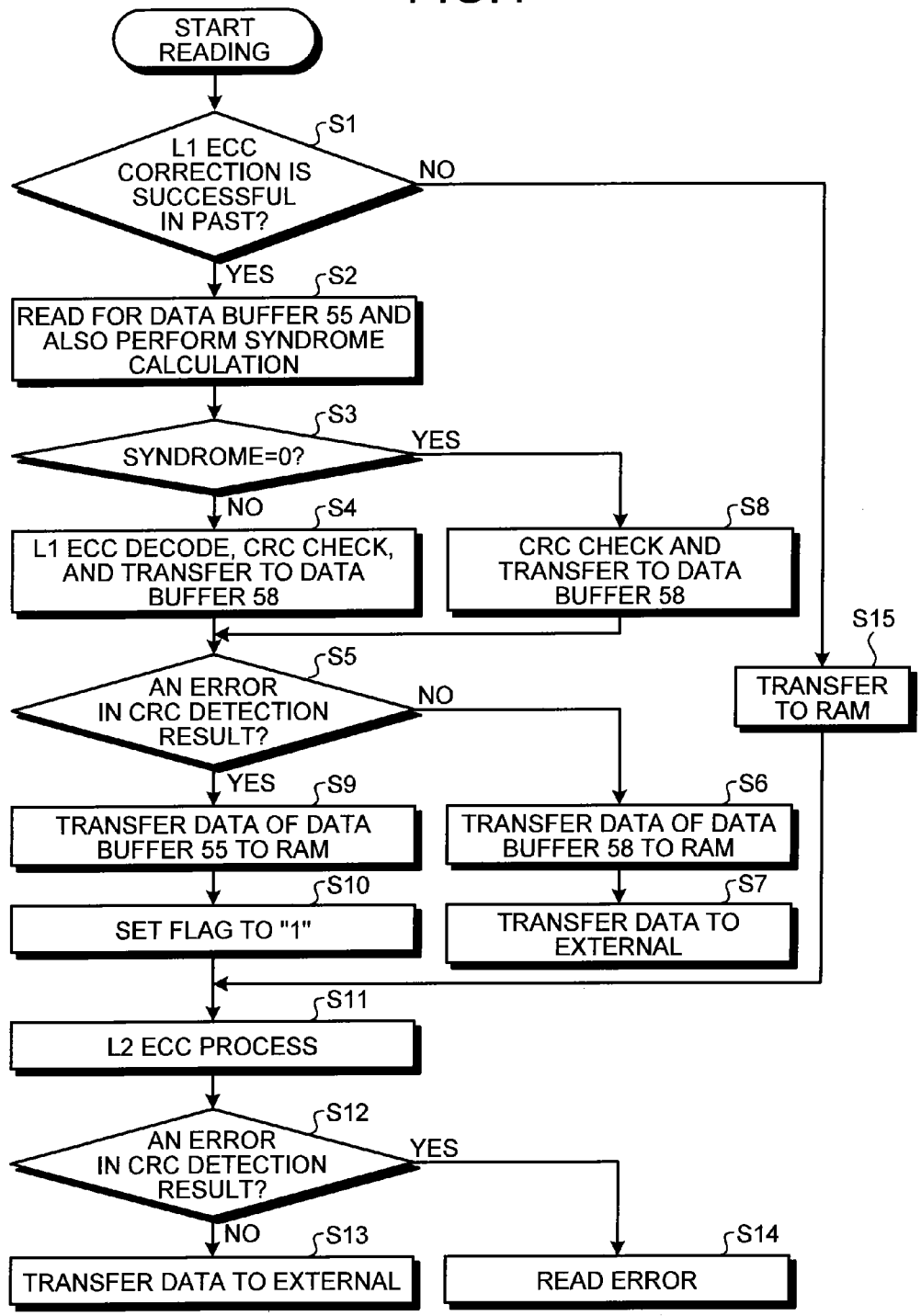
FIG. 4 is a flowchart illustrating an example of a read processing procedure, in the first embodiment.

FIG. 4 is a flowchart illustrating an example of a read processing procedure in this embodiment. FIG. 4 illustrates a read processing procedure for each L1 unit data, when an L2 unit data includes one L1 unit data (N=1).

The control register unit 52 refers to the error correction history information for the L1 unit data corresponding to an address specifying target data to be read, to determine whether the L1 ECC correction is successful in the past (flag of the L1 ECC shows "1") (Step S1). When the L1 ECC correction is successful in the past (Step S1 Yes), the control register unit 52 instructs the NAND I/F 53 to read the corresponding L1 unit data from the NAND flash memory 3 into the data buffer 55 and simultaneously to input the read data into the L1 ECC syndrome generation unit 54 (Step S2). The L1 ECC syndrome generation unit 54 executes syndrome calculation, when the read L1 unit data is input.

The L1 ECC syndrome generation unit 54 determines whether the L1 unit data input through the syndrome calculation has no error (syndrome=0) (Step S3). When syndrome is not equal to 0 (the L1 unit data has an error) (Step S3 No), the L1 ECC syndrome generation unit 54 transfers the data to the L1 ECC decoder 56. Then, the L1 ECC decoder 56 outputs the data to the CRC checker 57 without performing the error correction process for the data. The CRC checker 57 executes CRC detection for the input data using a CRC code, and transfers the input data (L1 unit data for which the error correction process has not been performed) to the data buffer 58 (Step S4).

The CRC checker 57 determines whether the CRC detection result shows an error (Step S5). When there is no error (Step S5 No), the CRC checker 57 instructs the selector 59 to read the data of the data buffer 58. Then, the selector 59 reads the data after error-corrected from the data buffer 58, in response to the instruction, and transfers the read data to the DMAC 51. The DMAC 51 transfers the data output from the selector 59 to the RAM 4 through the RAMC 22 (Step S6). The data transferred to the RAM is transferred by an external host through the I/F 21, in response to an instruction of the CPU 23 (Step S7).

When it is determined that the L1 unit data has no error based on the syndrome calculation (syndrome=0) in Step S3 (Step S3 Yes), the corresponding L1 unit data is input to the L1 ECC decoder 56. Then, the L1 ECC decoder 56 performs an error correction process for the input L1 unit data using an L1 ECC code, and the CRC checker 57 executes CRC detection for the error-corrected data using the CRC code, and stores the error-corrected data into the data buffer 58 (Step S8), and the flow proceeds to step S5.

In Step S5, when the CRC detection result has an error (Step S5 Yes), the CRC checker 57 instructs the selector 59 to read data from the data buffer 55. In response to this instruction, the selector 59 reads data before error correction from the data buffer 55, and transfers the read data to the DMAC 51. Then, the DMAC 51 transfers the data output from the selector 59 to the RAM 4 through the RAMC 22 (Step S9). Upon reception of a failure result of the error correction through the L1 ECC process of the CRC checker 57, the NANDC 25 informs the CPU 23 about the failure result. Then, the CPU sets "1" in the flag of the L1 ECC result corresponding to the L2 unit data of the error correction history management table 41 (Step S10). The CPU 23 instructs the L2 ECC decoder 24 to start an L2 ECC process for the L2 unit data including the corresponding L1 unit data (Step S11).

The L2 ECC decoder 24 reads the L2 unit data including the corresponding L1 unit data from the RAM 4 to execute the L2 ECC process, performs CRC detection using the L1 CRC code, after the L2 ECC process, and determines whether the CRC detection result shows an error (Step S12). When the CRC detection result shows no error (Step S12 No), the data after the L2 ECC process is temporarily stored in the RAM 4, and transfers the data to the external (Step S13), and the process ends. When the CRC detection result shows an error (Step S12 Yes), a read error is issued (Step S14).

When it is determined that the L1 ECC correction is not successful (flag of the L1 ECC result shows "1") in the past (Step S1 No) based on the error correction history information for the L1 unit data corresponding to the address set to specify data to be read in Step S1, the control register unit 52 instructs the NAND I/F 53 to read the corresponding L1 unit data from the NAND flash memory 3 and to input the data to the DMAC 51, also instructs the L2 ECC decoder 24 to start the L2 ECC process for the L2 unit data including the corresponding L1 unit data. The DMAC 51 transfers the data input from the I/F 53 to the RAM 4 (Step S15), and the flow proceeds to Step S11.

As described above, in this embodiment, the flow shifts immediately to the L2 ECC process without executing the L1 ECC decoding (L1 ECC process) for the L1 unit data for which the L1 ECC correction is not successful in the past. This realizes a high-speed read process. In the above example, when the data without error or data after errorcorrection through the L1 ECC is externally transferred, the data is stored temporarily in the RAM 4. However, the data is not necessarily store din the RAM 4, and may directly and externally be transferred. In step S9 and step S15, the DMAC 51 may directly output the data to the L2 ECC decoder 24.

Descriptions will now be made to a process when the L2 unit data includes two or more units of L1 unit data (when N is equal to or greater than 2). In response to a read instruction from the host through the I/F 21, like N=1, the CPU 23 sets an address (on the NAND flash memory 3) corresponding to target data to be read, to the control register unit 52. The CPU 23 sets error correction history information corresponding to target data to be read into the control register unit 52 by referring to the error correction history management table 41. At this time, the CPU 23 sets an address(s) (on the NAND flash memory 3) and error correction history information of another L1 unit data included in the L2 unit data including the L1 unit data to be read, into the control register unit 52.

For example, N=2, and L1 unit data with addresses "0000" and "0001" form L2 unit data #1, while L1 unit data with addresses "0002" and "0003" form L2 unit data #2. In this case, when reading three data units of L1 unit data "0000" to "0002", the CPU 23 sets not only the addresses "0000" to "0002" specifying the data to be read and error correction history information into the control register unit 52, but also the address "0003" specifying data not to be read. Note that since the L1 unit data of the address "0003" is target data to be read for performing the L2 process, this L1 unit data is distinguished from the three L1 unit data corresponding to "0000" to "0002". That is, the target L1 unit data to be read and the L1 unit data for L2 process are set in the control register unit 52 in the form of different tables. The target L1 unit data to be read and the L1 unit data for L2 process are set in association with each other.

Figure 5:
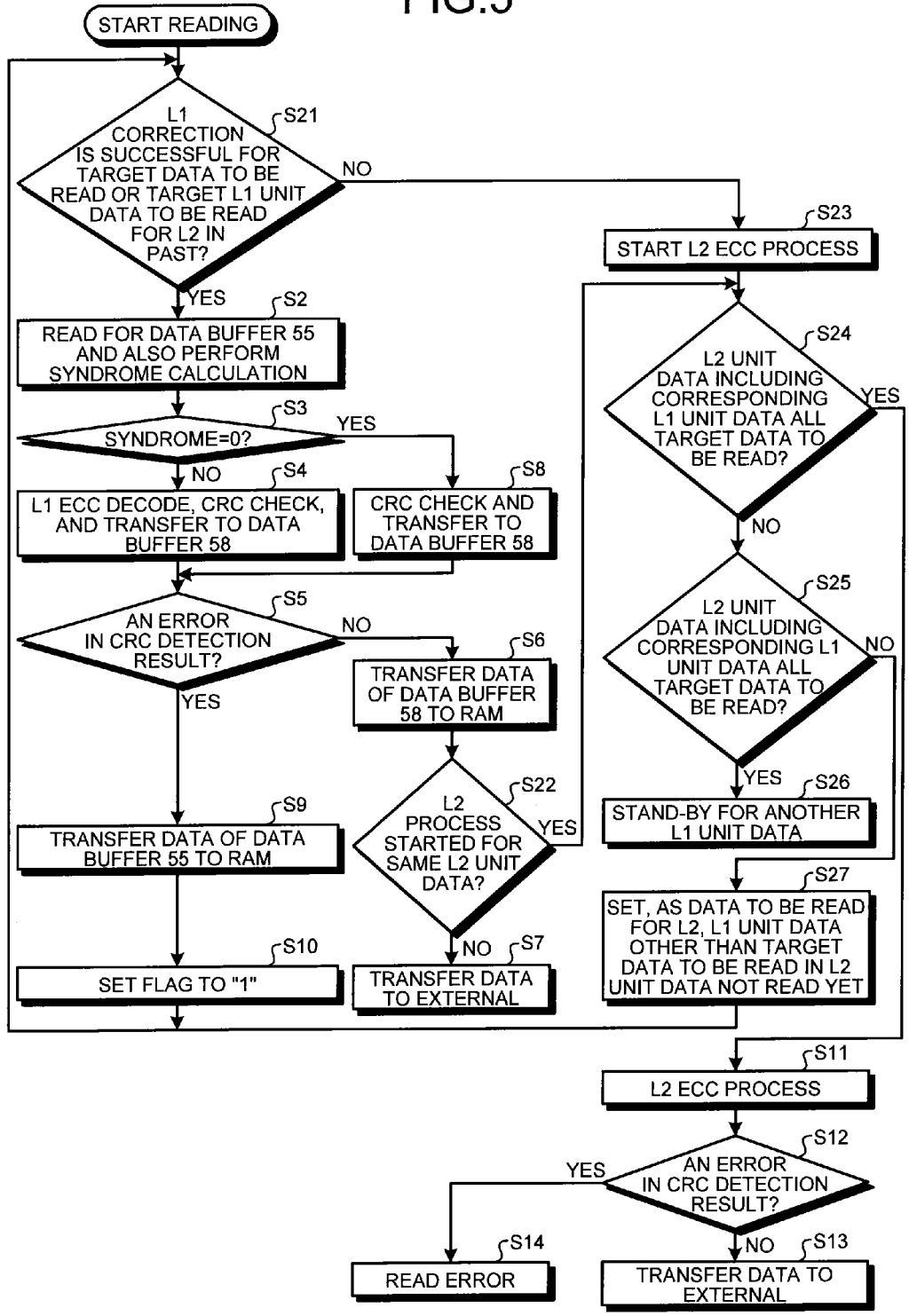
FIG. 5 is a flowchart illustrating an example of a read processing procedure, when N is equal to or greater than 2.

FIG. 5 is a flowchart illustrating an example of a read processing procedure, when N is equal to or greater than 2. The process exemplarily illustrated in FIG. 5 is executed for each target L1 unit data to be read. The control register unit 52 determines whether L1 ECC correction is successful in the past (flag of L1 ECC result shows "1"), based on the error correction history information for L1 unit data (or target L1 unit data to be read for L2, as will be described later) corresponding to an address specifying target data to be read (Step S21).

When the L1 ECC correction is successful in the past (Step S21 Yes), those same steps of Step S2 to Step S10 as those of FIG. 4 are executed. In the example of FIG. 5, after Step S6, the CPU 23 (or the control register unit 52) determines whether the L2 ECC process has already been started (L2 unit data including target L1 unit data to be processed include target L1 unit data for L2 process) (Step S22). If the L2 ECC process has not started yet (Step S22 No), the flow proceeds to step S7.

When the L1 ECC correction is not successful in the past (Step S21 No), the control register unit 52 instructs the L2 ECC decoder 24 to read the corresponding L1 unit data from the NAND flash memory 3 to input the read data to the DMAC 51, and instructs the L2 ECC decoder 24 to start the L2 ECC process for the L2 unit data including the L1 unit data. Then, the DMAC 51 transfers the data input from the NAND I/F 53 to the RAM 4 (Step S23). The control register unit 52 may instruct the L2 ECC decoder 24 through the CPU 23 to start the L2 ECC process for the L2 unit data including the corresponding L1 unit data (target L1 unit data to be read).

The L2 ECC decoder 24 determines whether target L2 unit data for L2 ECC process exists in the RAM 4 (Step S24). When the target L2 unit data for L2 ECC process exists (Step S24 Yes), Step S11 to Step S14 are executed like FIG. 4.

When the target L2 unit data for L2 ECC process does not exist (Step S24 No), it is determined whether the entire L2 unit data, including the corresponding L1 unit data (L1 unit data being read), is target data to be read (Step S25). When the L2 unit data including the L1 unit data being read is entirely target data to be read (Step S25 Yes), another L1 unit data is read and will be in a stand-by mode until transmitted for the L2 ECC process (Step S26).

When the L2 unit data including the L1 unit data being read (Step S25) includes a data part not to be read (Step S25 No), the L1 unit data which has not been read yet is set as read data for L2, and the flow returns to step S21. Specifically, this L1 unit data is other than the target L1 unit data to be read included in the L2 unit data to be processed.

In step S22, when it is determined that the L2 ECC process has been started (Step S22 Yes) the flow proceeds to step S24.

After this, in the stand-by mode in Step S26, the same process illustrated in FIG. 5 is executed for the next L1 unit data. Step S24 is executed through after Step S22, and the L2 ECC process is executed at a point of time the L2 unit data exists.

As described in the example of FIG. 4, in the example of FIG. 5, when the data without error or error-corrected data after L1 ECC process is externally transferred, the data is stored temporarily in the RAM 4. However, the data may directly and externally be transferred without being stored in the RAM 4. The L2 ECC decoder 24 may have a buffer, and in Step S9 and Step S23, the DMAC 51 may output data directly to the L2 ECC decoder 24.

The descriptions have been made to the case of executing the two-step ECC process. Similarly, in the case of executing a three-step ECC process, a high-speed process may be realized using error correction history information. FIG. 6 is a diagram illustrating a configuration example of an error correction history management table, when a five-step ECC process is executed. In the example of FIG. 6, a four-bit flag is used for each L1 unit data, as error correction history information.

For example, four bits of the four bit flag specify whether corrections are not successful respectively through the L1 ECC process, the L2 ECC process, the L3 ECC process, and the L4 ECC process, in the order from the least significant bit. For example, the entire bits are set to "0" as an initial bit, and a corresponding bit is set to "1", when the correction is not successful in each process step. In FIG. 6, in the abovedescribed example, the four bit flag is used for each L1 unit data. However, when the L1 unit data and the L2 or more unit data have different data sizes, the flag may be kept for each data unit in each step. For example, when the L2 unit data includes eight L1 unit data, or when a flag is kept for each L2 unit data, the flag of the L2 ECC process may simply hold one bit information for eight L1 unit data, thus reducing an amount of information to be kept.

When performing three-step (or more steps) ECC process, processes are performed in the steps from L1 ECC, L2 ECC, . . . . Thus, in the ECC process of each step, the ECC process of a corresponding step is not performed for data for which correction is not successful in the past in the ECC process of the step, using the error correction history management table illustrated in FIG. 6. Instead, the ECC process of the next step is executed.

In this embodiment, the error correction history management table 41 is kept in the RAM 4. However, the table 41 may be kept in any other place, such as the NAND flash memory 3, or the NANDC 52. For example, when the RAM 4 is a non-volatile RAM, the management information remains even if the power is OFF. On the contrary, when the RAM 4 is a volatile RAM, the error correction history management table 41 disappears, if the power is OFF. Thus, while the power is ON, the error correction history management table 41 may be stored in the RAM 4, and while the power is OFF, the error correction history management table 41 may be stored in an available space in the NAND flash memory 3. In this case, when the power is ON, the error correction history management table 41 is read into the RAM 4 every time. Even if the error correction history management table 41 disappears, the operations are still guaranteed. Thus, when the RAM 4 is a volatile RAM, data is not necessarily stored in the NAND flash memory 3, thus reducing a burden of writing on the NAND flash memory 3.

In this embodiment, when correction is successful in the past L1 ECC process like the target L1 unit data to be read (to be externally transferred), L1 ECC decoding is performed for the L1 unit data read for the L2 process. Note that this L1 unit data for the L2 process itself is not target data to be read, but is read for performing the L2 ECC process for the target L1 unit data to be read. However, the L1 ECC decoding may not be performed for the L1 unit data read for the L2 process, and data read from the NAND flash memory 3 may be given for the L2 ECC process. In this case, the L1 unit data read for L2 process is input for the L2 ECC process without correcting an error which can be corrected through the L1 ECC process. This realizes a further reduction in the read processing time. Information indicating whether an error has been corrected through the L1 ECC process (whether an error exists before the L1 ECC process) is kept in the error correction history management table 41, in association with each L1 unit data. The data read for the L2 process without error correction in the past L1 ECC process may be given for the L2 ECC process as is, while the data read for the L2 process with error correction in the past L1 ECC process may be L1 ECC-processed.

In this embodiment, the control register unit 52 has a function as an error correction process control unit that controls the error correction process by determining whether to execute the L1 ECC process based on the error correction history information. However, an error correction process control unit may be formed independently from the control register unit 52.

As described above, in this embodiment, information indicating whether the correction has not been successful in the past is kept as error correction history information. In the ECC process of each step, the ECC process of a corresponding step is not executed for data for which error correction has not been successful through the past ECC process at the corresponding step, and the ECC process is executed at the next step. This realizes a reduction in the read processing time, as compared with the case for executing the L1 ECC process for each data.

(Second Embodiment)

FIG. 7 is a diagram illustrating a configuration example of the error correction history management table 41 kept by the memory system 1, according to the second embodiment. The configuration of the memory system 1 of this embodiment is the same as that of the first embodiment. Those constituent elements having the same function as those of the first embodiment are identified with the same reference numerals, and will not be explained again.

As illustrated in FIG. 7, the error correction history management table 41 of this embodiment includes flags of the L1 ECC results like the first embodiment and L1 ECC correction bits, in association with each L1 unit data. In this embodiment, the number of bits corrected through the past L1 ECC process is kept as an L1 ECC correction bit, in addition to information indicating whether error correction is not successful in the past L1 ECC, as error correction history information.

Figure 8:
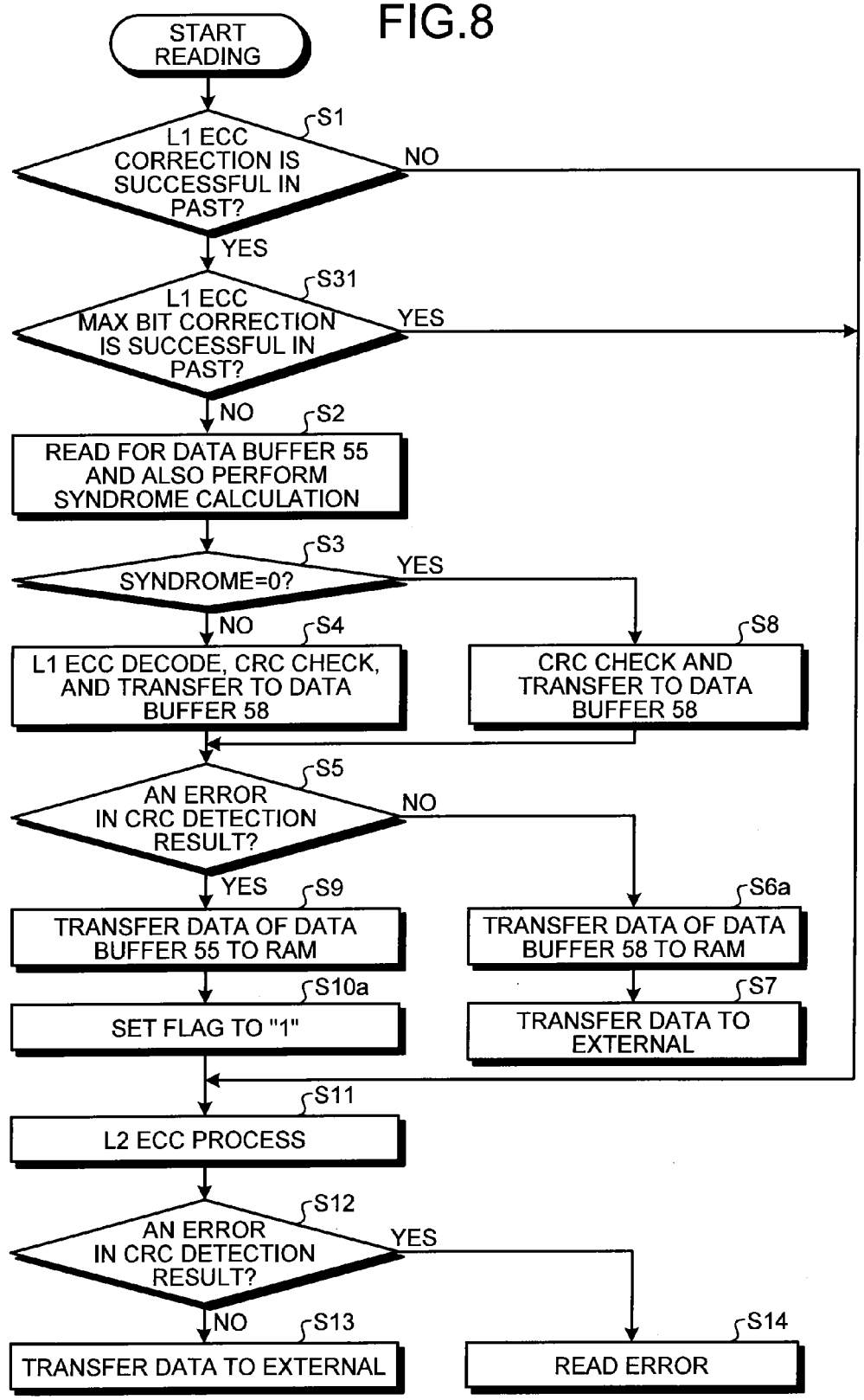
FIG. 8 is a flowchart illustrating an example of a read processing procedure, in the second embodiment.

FIG. 8 is a flowchart illustrating an example of a read processing procedure in this embodiment. FIG. 8 illustrates a read processing procedure for each L1 unit data, when the L2 unit data includes one L1 unit data (when N=1). A data write operation of this embodiment is the same as that of the first embodiment. When reading data in this embodiment, the CPU 23 sets an address(es) of target data to be read and its corresponding error correction history information into the control register unit 52, by referring to the error correction history management table 41. The CPU 23 also sets error correction history information corresponding to data in the L2 unit data including target data to be read, into the control register unit 52.

In this embodiment, like the first embodiment, Step S1 is executed, and when it is determined that the L1 ECC correction is successful in the past (Step S1 Yes), the control register unit 52 refers to the L1 ECC correction bits of the error correction information to determine whether the number of bits (L1 ECC correction bits) corrected through the past L1 ECC process for the L1 unit data being read is the maximum number of bits (Max bits) capable of being corrected through the L1 ECC process (Step S31). For example, when the number of the L1 ECC correction bits of the error correction information is three bits, it is determined that the maximum number of bits has already been corrected. When the number of the L1 ECC correction bits of the error correction information is equal to or lower than two, it is determined that the maximum number of bits has not been corrected yet.

When it is determined that the maximum number of bits capable of being corrected through the L1 ECC process has already been corrected (Step S31 Yes), the flow proceeds to step S2, and at the same time, executes Step S11. That is, the L1 ECC process is executed, while the L2 ECC process is started. When it is determined that the maximum number of bits capable of being corrected through the L1 ECC process has not been corrected yet (Step S31 No), the flow proceeds to step S2. The process other than the above-described read processing procedure of this embodiment is the same as that of the first embodiment illustrated in FIG. 4. Note, however, that in step S10a, the flow proceeds to step S11, when the L2 ECC process has not been started yet. When the L2 ECC process has already been started, the process ends as is. In step S6a, data of the data buffer 58 is transferred to the RAM 4, and the CRC checker 57 informs the CPU 23 about the number of bits corrected through the L1 ECC process, and the error correction history management table 41 is updated based on the informed number of bits. Let it be assumed that the CRC checker 57 is informed about the number of bits corrected through the L1 ECC process, by the L1 ECC decoder 56.

In the past L1 ECC process, when the maximum number of bits capable of being corrected has been corrected, the L1 unit data may have many errors in the next L1 ECC process, thus increasing the chance of not achieving the correction. In this embodiment, when the maximum number of bits capable of being corrected has been corrected through the past L1 ECC process, the L2 ECC process is executed in parallel with the L1 ECC process. This reduces the reading time when the correction is not successful through the L1 ECC process.

FIG. 8 illustrates an example in which the L2 unit data includes one L1 unit data (when N=1). However, when N=2 or greater, the reading time can be reduced, like the example of FIG. 8. Specifically, after Step S21 of FIG. 5, a determination is made as to whether the maximum number of bits capable of being corrected has been corrected through the past L1 ECC process. The flow proceeds to Step S23 to start the L2 ECC process, when the maximum number of bits capable of being corrected has been corrected through the past L1 ECC process, thereby realizing a reduced reading time. When executing a three (or greater)-step ECC process, the same process is executed, thereby reducing the reading time. The above-described operations of this embodiment are the same as those of the first embodiment.

In this embodiment, when the maximum number of bits capable of being corrected has been corrected through the past L1 ECC process, the L2 ECC process is parallelly executed. The maximum number of bits capable of being corrected is not the only one threshold value for use in determining whether to parallelly execute the L2 ECC process. Another threshold value may be set. For example, the threshold value may be a number of bits that is smaller than the maximum number of bits capable of being corrected, by one.

Accordingly, in this embodiment, information indicating the number of bits capable of being corrected through the L1 ECC process is kept, in addition to information indicating whether correction is not successful through the past L1 ECC process. The ECC process of the next step is parallelly started for the data including the maximum number of corrected bits capable of being corrected through the past L1 ECC process. Thus, the reading time can more be reduced as compared to the case of the first embodiment.

(Third Embodiment)

FIG. 9 is a diagram illustrating a configuration example of the error correction history management table 41 kept by the memory system 1 according to the third embodiment. The configuration of the memory system 1 of this embodiment is the same as that of the memory system 1 of the first embodiment. Those constituent elements having the same function as those of the first embodiment are identified with the same reference numerals, and will not be explained again.

As illustrated in FIG. 7, the error correction history management table 41 of this embodiment includes flags of the L1 ECC results like the first embodiment, L1 ECC correction bits, and the numbers of "Read" times/Block (the number of read times for each Block), in association with each L1 unit data. The L1 ECC correction bits are the same those of the second embodiment.

In the second embodiment, based on the number of "Read" times/Block in addition to the maximum number of bits capable of being corrected through the past L1 ECC process, a determination is made as to whether the L1 unit data has a high chance of not achieving the L1 correction. The read disturbance occurs due to repeated application of high voltage to non-selective cells (cells of entire pages except the target page to be read, in the unit of Blocks). Thus, there is a higher chance of occurrence of read disturbance, as the number of times a cell becomes a non-selective cell increases. In this example, instead of the number of times a cell becomes a non-selective cell, the number of read times for each Block is approximately used. As a result, it is possible to estimate the occurrence chance of read disturbance without going through a complicated process. The number of "Read" times/Block is managed in the unit of Blocks. Addresses "0000" to "0003" illustrated in FIG. 9 are the addresses in the same Block. Instead of using the number of "Read" times/Block, the number of times a cell becomes a non-selective cell in association with each L1 unit data may be used.

In this embodiment, in the determination of step S31 of the second embodiment, a determination is made as to whether the number of "Read" times/Block has exceeded a threshold value, in addition to the determination as to whether the maximum number of bits capable of being corrected has been corrected in the past L1 ECC process. When the maximum number of bits capable of being corrected has been corrected in the past, and when the number of "Read" times/Block has exceeded the threshold value, the L2 ECC process is parallelly executed. This improves the accuracy of estimation of whether correction is not successful through the L1 ECC process, and also reduces the number of times the L2 ECC process is parallelly performed, as compared to the second embodiment.

Instead of the number of "Read" times/Block, the number of "Write" times/Block may be used. Both of the number of "Read" times/Block and the number of "Write" times/Block may be used. When both of the number of "Read" times/Block and the number of "Write" times/Block are used, the determination may be made based on whether the total of the number of "Read" times/Block and the number of "Write" times/Block exceeds a predetermined threshold value. This determination may simply be made as is, or may be made in addition to the determination based on whether the maximum number of bits capable of being corrected has been corrected in the past.

As described above, in this embodiment, in the determination of Step S31 of the second embodiment, not only the determination is made as to whether the maximum number of bits capable of being corrected has been corrected in the past L1 ECC process, but also the determination is made as to whether the number of "Read" times/Block exceeds a predetermined threshold value. As a result, the accuracy of estimation of whether correction is not successful through the L1 ECC process can be improved, and the number of times the L2 ECC process is parallelly performed can be reduced as compared with the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile semiconductor memory;
   an encoder that performs a first encoding process using unit data to generate first parity, and a second encoding process using the unit data to generate second parity;
   a memory interface that writes, into the non-volatile semiconductor memory, the unit data, the first parity, and the second parity;
   an error correction processing unit that performs a first error correction process based on the unit data read from the non-volatile semiconductor memory and the first parity corresponding to the unit data, and a second error correction process based on the unit data read from the non-volatile semiconductor memory and the second parity corresponding to the unit data;
   an error correction history recording unit which records error correction history indicating whether the first error correction process is not successful by the error correction processing unit, in association with each unit data; and
   an error correction processing control unit that controls the error correction processing unit to perform the first error correction process for the unit data read from the non-volatile semiconductor memory when the error correction history corresponding to the unit data is not recorded or indicates that the first error correction process was successful, controls the error correction processing unit to perform the second error correction process for the unit data when the first error correction process is not successful, and controls the error correction processing unit to perform the second error correction process for the unit data read from the non-volatile semiconductor memory without performing the first error correction process for the unit data when the error correction history corresponding to the unit data indicates that the first error correction process was not successful.

2. The memory system according to claim 1, wherein the error correction history is stored in the non-volatile semiconductor memory.

3. The memory system according to claim 1, wherein the error correction history includes a number of correction bits for the error correction process using the first parity.

4. The memory system according to claim 3, wherein the error correction processing control unit performs the first error correction process and parallelly starts to perform the second error correction process, when the number of correction bits corresponding to the unit data to be read is equal to or greater than a first threshold value.

5. The memory system according to claim 4, wherein the error correction processing control unit performs the first error correction process and parallelly starts to perform the second error correction process, when the number of correction bits corresponding to the unit data to be read is equal to or greater than the first threshold value, and when a number of times corresponding to the unit data is read is equal to or greater than a second threshold value.

6. The memory system according to claim 1, further comprising a semiconductor memory configured to temporarily record the error correction history.

7. The memory system according to claim 6, wherein the semiconductor memory is a non-volatile memory.

8. The memory system according to claim 6, wherein the semiconductor memory is a volatile memory, and the error correction history recorded in the semiconductor memory is written into the non-volatile semiconductor memory, when power is OFF, and the error correction history is read from the non-volatile semiconductor memory and written into the semiconductor memory, when power is ON.

9. The memory system according to claim 1, wherein when the unit data recorded in the non-volatile semiconductor memory is updated, the error correction history corresponding to the unit data is initialized.

10. The memory system according to claim 1, wherein the first parity is generated by error correction code and includes a hamming code or a BCH code for enabling correction for a small number of bits, and the second parity is generated by error correction code and includes a BCH code for enabling correction for a large number of bits or an LDPC code.

11. A control method for a memory system that includes a non-volatile semiconductor memory, comprising:
    performing a first encoding process using unit data to generate first parity, and a second encoding process using the unit data to generate second parity;
    writing, into the non-volatile semiconductor memory, the unit data, the first parity, and the second parity;
    performing a first error correction process based on the unit data read from the non-volatile semiconductor memory and the first parity corresponding to the unit data, and a second error correction process based on the unit data read from the non-volatile semiconductor memory and the second parity corresponding to the unit data;
    recording error correction history indicating whether the first error correction process is successful, in association with each unit data;
    controlling to perform the first error correction process for the unit data read from the non-volatile semiconductor memory when the error correction history corresponding to the unit data is not recorded or indicates that the first error correction process was successful;
    controlling to perform the second error correction process for the unit data when the first error correction process is not successful; and
    controlling to perform the second error correction process for the unit data read from the non-volatile semiconductor memory without performing the first error correction process for the unit data when the error correction history corresponding to the unit data indicates that the first error correction process was not successful.

12. The control method for a memory system according to claim 11, further comprising recording the error correction history into the non-volatile semiconductor memory.

13. The control method for a memory system according to claim 11, wherein the error correction history includes a number of correction bits for the error correction process using the first parity.

14. The control method for a memory system according to claim 13, further comprising:
    performing the first error correction process, and also controlling parallelly to start the second error correction process, when the number of correction bits corresponding to the unit data to be read is equal to or greater than a first threshold value.

15. The control method for a memory system according to claim 14, further comprising performing the first error correction process, and controlling to parallelly perform the second error correction process, when the number of correction bits corresponding to the unit data to be read is equal to or greater than the first threshold value, and when a number of times corresponding to the unit data is read is equal to or greater than a second threshold value.

16. The control method for a memory system according to claim 11, further comprising temporarily recording the error correction history in a semiconductor memory.

17. The control method for a memory system according to claim 16, wherein the semiconductor memory is a non-volatile memory.

18. The control method for a memory system according to claim 16, wherein
the semiconductor memory is a volatile memory, and
the error correction history recorded in the semiconductor memory is written into the non-volatile semiconductor memory, when power is OFF, and the error correction history is read from the non-volatile semiconductor memory and written into the semiconductor memory, when power is ON.

19. The control method for a memory system according to claim 11, wherein when the unit data recorded in the non-volatile semiconductor memory is updated, the error correction history corresponding to the unit data is initialized.

20. The control method for a memory system according to claim 11, wherein the first parity is generated by error correction code and includes a hamming code or a BCH code for enabling correction for a small number of bits, and the second parity is generated by error correction code and includes a BCH code for enabling correction for a large number of bits or an LDPC code.

* * * * *